United States Patent
Zhu et al.

(10) Patent No.: US 12,289,852 B2
(45) Date of Patent: Apr. 29, 2025

(54) MULTI-NODE SAFETY LOCKING DEVICE AND SERVER

(71) Applicant: INSPUR SUZHOU INTELLIGENT TECHNOLOGY CO., LTD., Jiangsu (CN)

(72) Inventors: Jingxian Zhu, Jiangsu (CN); Zhencai Cao, Jiangsu (CN); Ying Qian, Jiangsu (CN); Zhanyang Li, Jiangsu (CN)

(73) Assignee: INSPUR SUZHOU INTELLIGENT TECHNOLOGY CO., LTD., Jiangsu (CN)

( * ) Notice: Subject to any disclaimer, the term of this patent is extended or adjusted under 35 U.S.C. 154(b) by 17 days.

(21) Appl. No.: 18/039,823

(22) PCT Filed: Nov. 30, 2021

(86) PCT No.: PCT/CN2021/134198
§ 371 (c)(1),
(2) Date: Jun. 1, 2023

(87) PCT Pub. No.: WO2022/247191
PCT Pub. Date: Dec. 1, 2022

(65) Prior Publication Data
US 2024/0023266 A1    Jan. 18, 2024

(30) Foreign Application Priority Data
May 28, 2021  (CN) .......................... 202110592204.9

(51) Int. Cl.
*H05K 7/14*     (2006.01)

(52) U.S. Cl.
CPC ......... *H05K 7/1402* (2013.01); *H05K 7/1489* (2013.01)

(58) Field of Classification Search
None
See application file for complete search history.

(56) References Cited

U.S. PATENT DOCUMENTS

| 5,599,077 A | 2/1997 | Law et al. |
| 10,273,721 B1 * | 4/2019 | Chen ..................... E05B 63/143 |

(Continued)

FOREIGN PATENT DOCUMENTS

| CN | 1315158 A | 10/2001 |
| CN | 1834393 A | 9/2006 |

(Continued)

*Primary Examiner* — James Wu
*Assistant Examiner* — Christopher L Augustin
(74) *Attorney, Agent, or Firm* — IPro, PLLC

(57) ABSTRACT

The present application discloses a multi-node safe locking device. A guiding rail is disposed on a chassis, to enable a locking rod to translate perpendicularly to the moving direction of node modules. A guiding plate is assembled on the node modules, guiding grooves are disposed on the guiding plate, and the guiding grooves match with a plurality of limiting columns that protrude out of the locking rod. When the node modules moves, the limiting columns move relatively to the guiding grooves in a guiding path, to cause the locking rod to translate. When one of the node modules is pulled out, the guiding groove causes the locking rod to translate to the locking position, to block the other node module from being pulled out, the limiting column is separated from the notch of the guiding groove, and the guiding plate moves out along with the node module.

17 Claims, 6 Drawing Sheets

(56) References Cited

U.S. PATENT DOCUMENTS

| | | | | |
|---|---|---|---|---|
| 10,697,204 B1* | 6/2020 | Chen | ................... | A47B 88/919 |
| 2005/0210933 A1* | 9/2005 | Wen | ..................... | E05B 65/463 |
| | | | | 70/85 |
| 2006/0066187 A1* | 3/2006 | Chang | .................. | E05B 65/464 |
| | | | | 312/219 |
| 2008/0279490 A1* | 11/2008 | Holcomb | ............. | E05B 65/462 |
| | | | | 384/42 |

FOREIGN PATENT DOCUMENTS

| | | | |
|---|---|---|---|
| CN | 101469582 A | * | 7/2009 |
| CN | 101854789 A | | 10/2010 |
| CN | 202262657 U | | 6/2012 |
| CN | 202723082 U | | 2/2013 |
| CN | 106837009 A | | 6/2017 |
| CN | 107960764 A | | 4/2018 |
| CN | 108294512 A | | 7/2018 |
| CN | 110409932 A | | 11/2019 |
| CN | 213308452 U | | 6/2021 |
| CN | 113260214 A | | 8/2021 |

* cited by examiner

MULTI-NODE SAFETY LOCKING DEVICE AND SERVER

CROSS-REFERENCE TO RELATED APPLICATION

This application claims the priority of the Chinese Patent application filed on May 28, 2021 before the CNIPA, China National Intellectual Property Administration with the application number of 202110592204.9, and the title of "MULTI-NODE SAFETY LOCKING DEVICE AND SERVER", which is incorporated herein in its entirety by reference.

TECHNICAL FIELD

The present application relates to the technical field of servers and, more particularly, to a multi-node safe locking device and a server.

BACKGROUND

At least two node modules are usually installed inside the server, and each node module may be pulled out from the server. When two or more node modules are pulled out at the same time, the center of gravity of the server is caused to shift, and the center of gravity moves to the outside of the server housing, which will easily cause the server to topple.

Therefore, during operation, the operator is required to take time to pay attention not to pull out two node modules at the same time, but it is difficult to ensure that there are no errors due to man-made operation, so the problem of server toppling occurs from time to time, especially when testing is performed in the laboratory, the server is not installed on the server rack, and toppling phenomenon is more likely to occur.

At present, in the field of furniture, in order to prevent two drawers from being pulled out at the same time, a corresponding locking structure is also disposed. The existing structural solution for preventing the drawers from being pulled out at the same time occupies the space at both sides of the front end. However, for the space at the front end of the lateral array server node and the system architecture with limited space at the left and right sides of the node, such as a chassis with a height of 1 U or 2 U, the side edges of which are occupied by the slide rails, so the existing technical solution may not be used. In addition, the internal module of the server node has a scene that needs to be maintained from the side surface. The space on the side edge of the server node may not be occupied by the linkage interlock structure or the slide rail, otherwise the internal maintenance of the node module may be affected.

SUMMARY

The present disclosure provides a node safe locking device, which prevents other corresponding node modules from being pulled out when one node module is pulled out, reduces the risk of server toppling, and does not occupy the space at both sides of the front end of the node module. The solution is as follows:

the multi-node safe locking device includes a guiding rail, a locking rod and a plurality of guiding plates, and the guiding rail is disposed on a chassis, to enable the locking rod to translate perpendicularly to a moving direction of a plurality of node modules;

each of the guiding plates is assembled on one of the node modules, respectively, and each of the guiding plates is provided with a guiding groove; a plurality of limiting columns protrude out of the locking rod, each of the limiting columns is correspondingly insertable into one of the guiding grooves, and the limiting column is movable along a guiding path in the guiding groove;

when one of the node modules is pulled out, the guiding groove enables the locking rod to translate to a locking position, to block the other node modules from being pulled out; one of the guiding plates that is mounted the pulled out node module and the corresponding limiting column are separated from a notch of the guiding groove; and when one of the node modules is pushed back inwardly, the limiting column corresponding to the node module enters from the notch of the guiding groove, and the guiding groove causes the locking rod to translate to an unlocking position.

In some embodiments, the guiding grooves is an opening that perpendicularly extends throughout a plane of the guiding plate.

In some embodiments, the guiding groove is a groove, one side of the groove is provided with a stopping block and the other side of the groove is provided with a guiding sloping block, the stopping block and the guiding sloping block are protruding towards each other, a projection of the stopping block and a projection of the guiding sloping block in the moving direction of the node modules have an overlapping part, and the stopping block is further from the notch than the guiding sloping block;

the stopping block includes a blocking edge and an unlocking guiding edge, the blocking edge is parallel to a translating direction of the locking rod, and an acute angle is formed between the unlocking guiding edge and the blocking edge; and the guiding sloping block includes a locking-up guiding edge, and an acute angle is formed between the locking-up guiding edge and the blocking edge.

In some embodiments, the guiding sloping block further includes a resetting guiding edge, and the resetting guiding edge forms a horn mouth at the notch of the guiding groove.

In some embodiments, a damping elastic sheet is disposed on the guiding rail, the locking rod is provided with two damping holes, and when the locking rod translates to the unlocking position or the locking position, the damping elastic sheet is elastically limited by one of the damping holes.

In some embodiments, the guiding plate is placed horizontally, and is laterally protruded at an inner end portion of the node module.

In some embodiments, the multi-node safe locking device further includes an unlocking connecting rod, an extending direction of the unlocking connecting rod is parallel to the moving direction of the node modules, and the unlocking connecting rod moves in the extending direction; and an unlocking lean edge is disposed at an inwardly stretching end of the unlocking connecting rod, and when the unlocking connecting rod moves in an unlocking direction, the unlocking lean edge pushes the locking rod to move from the unlocking position to the unlocking position.

In some embodiments, an outwardly stretching end of the unlocking connecting rod is rotatably connected to an unlocking handle, and when the unlocking handle rotates, the unlocking handle is capable of driving the unlocking connecting rod to move outwardly parallel to the node modules to realize unlocking.

The present application further provides a server, wherein the server includes the multi-node safe locking device according to any one of the above embodiments.

In the multi-node safe locking device according to the present application, a guiding rail is disposed on a chassis, to enable a locking rod to translate perpendicularly to the moving direction of node modules. A guiding plate is assembled on the node modules, guiding grooves are disposed on the guiding plate, and the guiding grooves match with a plurality of limiting columns that protrude out of the locking rod. When the node modules move, the limiting columns move relatively to the guiding grooves in a guiding path, to cause the locking rod to translate, whereby the locking rod may move to a locking position and an unlocking position. When one of the node modules is pulled out, the guiding groove causes the locking rod to translate to the locking position, to block the other node module from being pulled out, the limiting column is separated from the notch of the guiding groove, and the guiding plate moves out along with the node module. When the node module is pushed back inwardly, the limiting column corresponding to the node module enters from the notch of the guiding groove, and the guiding groove drives the locking rod to translate to the unlocking position, at which point any one of the node modules may be pulled out. The device may realize locking of two or more node modules at a same time, whereby at the same moment merely one of the node modules may be pulled out, thereby ensuring the operation safety.

BRIEF DESCRIPTION OF THE DRAWINGS

In order to more clearly illustrate the technical solutions of the embodiments of the present application or the prior art, the figures that are required to describe the embodiments or the prior art may be briefly described below. Apparently, the figures that are described below are merely embodiments of the present application, and a person skilled in the art may obtain other figures according to these figures without paying creative work.

Figure 1A:
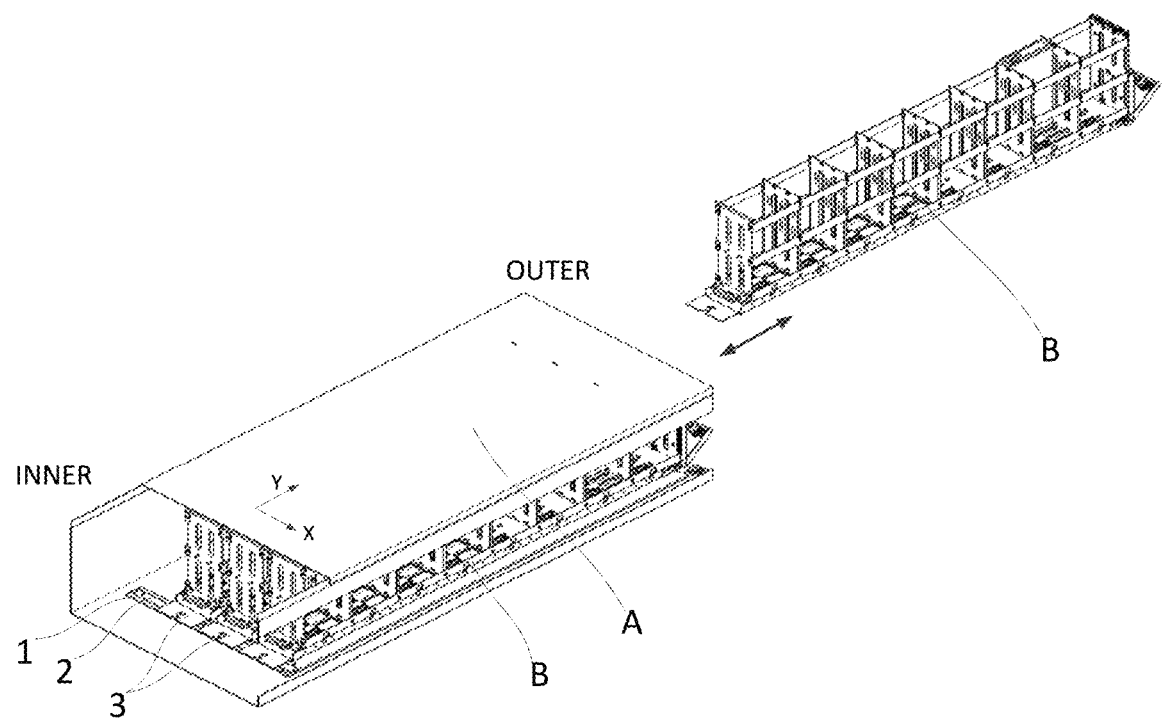
FIG. 1A is a structural diagram of the assembling between the multi-node safe locking device and the chassis.

REFERENCE NUMBERS guiding rail 1, damping elastic sheet 11, locking rod 2, limiting column 21, damping hole 22, guiding plate 3, guiding groove 31, stopping block 32, blocking edge 321, unlocking guiding edge 322, guiding sloping block 33, locking-up guiding edge 331, resetting guiding edge 332, unlocking connecting rod 4, unlocking lean edge 41 and unlocking handle 42.

DETAILED DESCRIPTION

The core of the present application is to provide a multi-node safe locking device, which, without occupying the space at both sides of the front end of the node modules, when one of the node modules is pulled out, prevents the other corresponding node module from being pulled out, to reduce the risk of toppling of the server.

In order to enable a person skilled in the art to better understand the technical solutions of the present application, the multi-node safe locking device according to the present application may be described in detail below with reference to the drawings and the embodiments.

The present application provides a multi-node safe locking device. The device includes a guiding rail 1, a locking rod 2 and a plurality of guiding plates 3, the guiding rail 1 is disposed on a chassis, the locking rod 2 is limited and assembled at the guiding rail 1, the locking rod 2 slides relatively to the guiding rail 1, and the locking rod 2 translates perpendicularly to the moving direction of a plurality of node modules.

Each of the guiding plates 3 is assembled on one of the node modules, respectively, the guiding plate 3 moves synchronously with the node modules, each of the guiding plates 3 is provided with a guiding groove 31, a plurality of limiting columns 21 protrude out of the locking rod 2, each of the limiting columns 21 is correspondingly insertable into one of the guiding grooves 31, the limiting column 21 and the guiding groove 31 move in cooperation with each other, and the limiting column 21 is movable along a guiding path in the guiding groove. It should be noted that the limiting column 21 moves in a straight line along with the locking rod 2, the guiding groove 31 moves in a straight line along with the guiding plate 3, the moving directions of the locking rod 2 and the guiding plate 3 are substantially perpendicular to each other, and the limiting column 21 moves in different directions in sequence along the guiding path of the guiding groove.

When one of the node modules is pulled out, the side edges of the guiding groove 31 apply an acting force to the limiting column 21, to enable the locking rod 2 to translate to a locking position, and the other limiting columns 21 block the other node modules from being pulled out. One of the guiding plates 3 that is mounted the pulled out node module and the corresponding limiting column 21 are separated from a notch of the guiding groove 31. When the limiting column 21 reaches the notch of the guiding groove 31, the node module may be completely pulled out.

When one of the node modules is pushed back inwardly, the limiting column 21 corresponding to the node module enters from the notch of the guiding groove 31, the side walls of the guiding groove 31 push the limiting column 21, and the guiding groove 31 causes the locking rod 2 to translate to an unlocking position.

In the present application, each of the node modules is provided with an independent guiding plate 3, and each of the guiding plates 3 is provided with the guiding grooves 31. Because the locking rod 2 cannot move in the moving direction of the node modules, when the locking rod 2 is at the locking position, the limiting column 21 and the side walls of the guiding groove 31 match with each other and are limited. At this point, when the node module is pulled outwardly, it is blocked by the corresponding limiting column 21, and that node module cannot be pulled out.

When the locking rod 2 is at the unlocking position, all of the guiding plates 3 are not blocked by the limiting columns 21, and any one of the node modules may be pulled out. When a certain node module is pulled out, it drives the locking rod 2 to move to the locking position again.

The locking rod 2 may correspondingly match with two or more node modules, to ensure that, in operation, merely one node module is allowed to be pulled out one time, and the other node module cannot be pulled out. The device does not occupy the space at both sides of the front end of the node modules, and prevents danger caused by shift of the center of gravity.

Figure 1B:
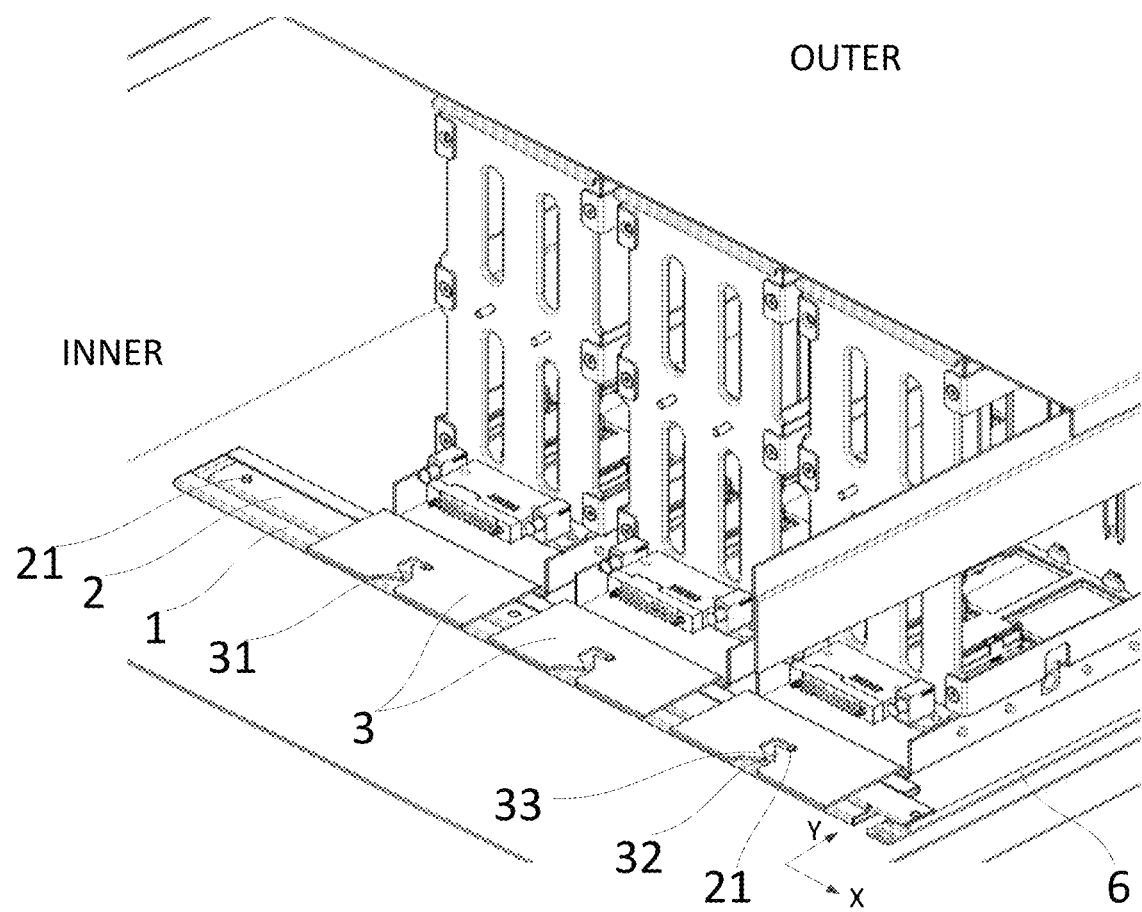
FIG. 1B is a partially enlarged view of the inner end portion of FIG. 1A.

Referring to FIG. TA, FIG. TA is a structural diagram of the assembling between the multi-node safe locking device and the chassis, wherein in the figure, A represents the chassis, B represents the node module, and the node module moves in the direction shown by the double arrows in the figure. FIG. 1B is a partially enlarged view of the inner end portion of FIG. TA. The length direction of the guiding rail 1 is the x-axis direction, and the node module moves in the y-axis direction.

The guiding groove 31 according to the present embodiment is an opening that perpendicularly extends throughout the plane of the guiding plate 3. The opening forms the guiding path. The guiding groove 31 is an un-closed opening, and one side of the opening is in communication with the external. The guiding path in the form of the opening facilitates the manufacturing. Besides the form of the opening, a guiding block that protrudes out of the plane of the guiding plate 3 may be disposed to form the guiding path.

The guiding groove 31 is a groove, one side of the groove is provided with a stopping block 32 and the other side of the groove is provided with a guiding sloping block 33, the stopping block 32 and the guiding sloping block 33, and protruding towards each other. Referring to FIG. 1B, the guiding groove 31 is equivalent to a stopping block 32 and a guiding sloping block 33 that protrude out of the two opposing side walls of a rectangular orifice, and the stopping block 32 is further from the notch than the guiding sloping block 33, and the guiding groove 31 is overall approximately of a S shape.

The projection of the stopping block 32 and the projection of the guiding sloping block 33 in the moving direction of the node modules have an overlapping part. In other words, in the figure, the projections in the y-axis direction have an overlapping part. The stopping block 32 is further from the notch than the guiding sloping block 33.

The stopping block 32 includes a blocking edge 321 and an unlocking guiding edge 322, the blocking edge 321 is parallel to the translating direction of the locking rod 2, and an acute angle is formed between the unlocking guiding edge 322 and the blocking edge 321. The outline of the stopping block 32 is of a triangle, and there is a spacing between the blocking edge 321 and the edge at an outmost (OUTER) side of the guiding groove 31, which may accommodate the limiting column 21. When the limiting column 21 contacts the blocking edge 321, when the node module is pulled outwardly, it is blocked by the limiting column 21, and cannot be pulled out, to realize the effect of locking.

The guiding sloping block 33 includes a locking-up guiding edge 331, and an acute angle is formed by the locking-up guiding edge 331 and the blocking edge 321. The locking-up guiding edge 331 inclines toward the inner side (INNER). When the node module is pulled outwardly, the limiting column 21 contacts the locking-up guiding edge 331, and because the locking-up guiding edge 331 inclines, it may push the locking rod 2 to move toward the locking position.

Correspondingly, when the pulled-out node module is pushed back, the limiting column 21 contacts the unlocking guiding edge 322, the unlocking guiding edge 322 and the locking-up guiding edge 331 are generally parallel, and the unlocking guiding edge 322 pushes the locking rod 2 to move toward the unlocking position.

Figure 2A:
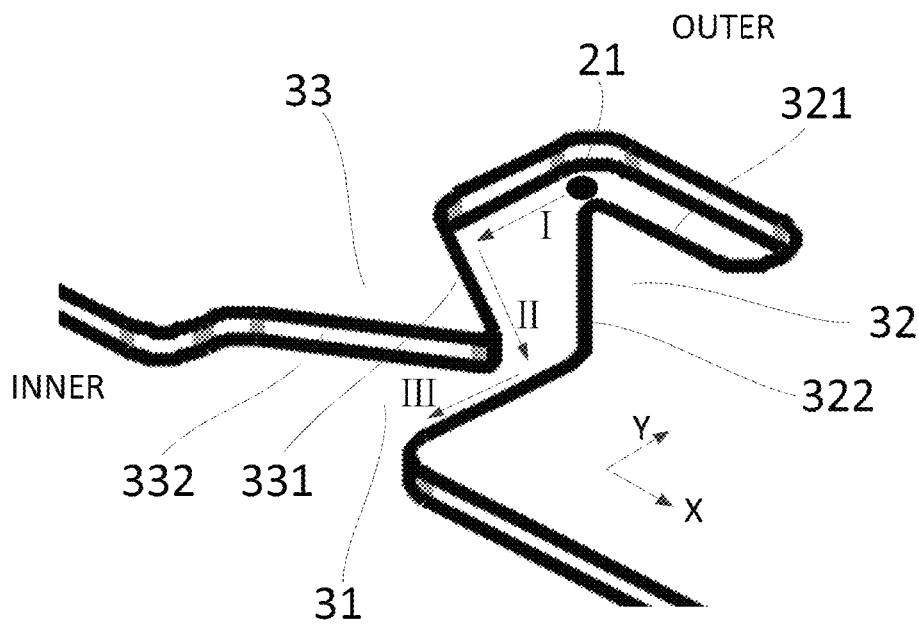
FIG. 2A is the moving path of the limiting column corresponding to the node module pulled outwardly relatively to the guiding groove.

Referring to FIG. 2A, FIG. 2A is the moving path of the limiting column 21 corresponding to the node module pulled outwardly relatively to the guiding groove 31. When the node module is pulled outwardly, the node module moves in the y-axis direction. At this point, the limiting column 21 moves in the direction of the arrow I, contacts the locking-up guiding edge 331 of the guiding sloping block 33, moves along the locking-up guiding edge 331 in the direction of the arrow II, and finally moves in the direction of the arrow III. At this point, the node module and the locking rod 2 are separate from each other, and the locking rod 2, because of the locking-up guiding edge 331, along the guiding rail 1, completes the translation from left to right in the actual space.

Figure 2B:
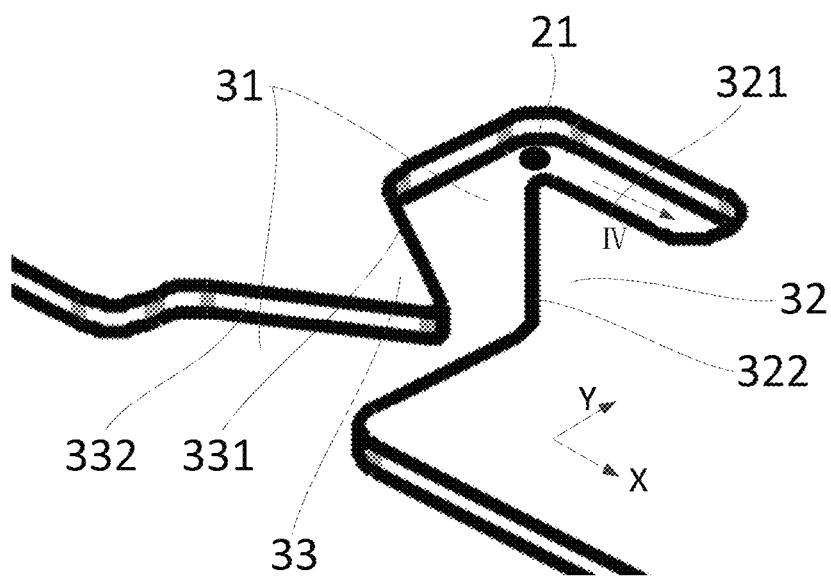
FIG. 2B is the moving path of the limiting column corresponding to the locking process of the node module that is not pulled out relatively to the guiding groove.
Figure 2C:
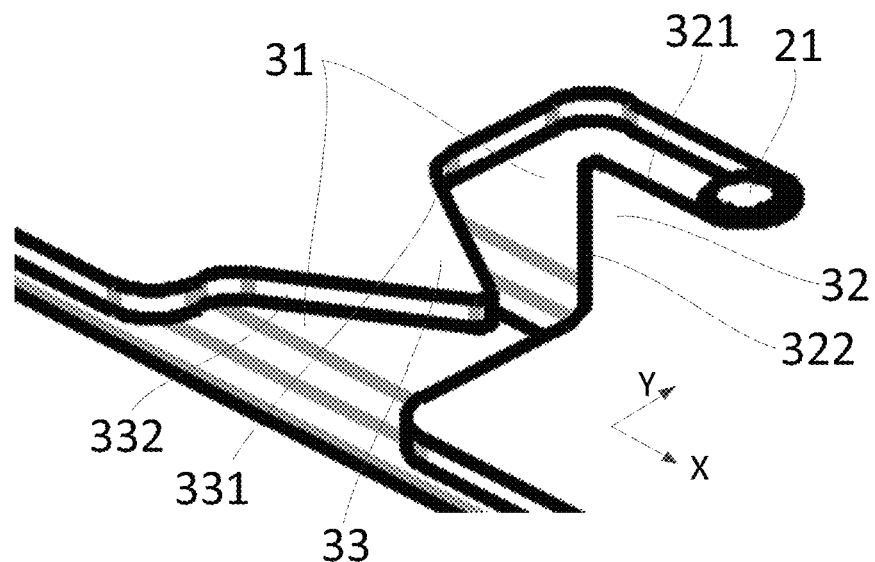
FIG. 2C is a schematic structural diagram of the limiting column corresponding to the node module that is not pulled out blocked by the stopping block.

As shown in FIG. 2B, FIG. 2B is the moving path of the limiting column 21 corresponding to the locking process of the node module that is not pulled out relatively to the guiding groove 31. The limiting column 21 translates rightward along the arrow IV relatively to the guiding plate 3 that is not pulled out, and finally reaches the position shown in FIG. 2C. FIG. 2C is a schematic structural diagram of the limiting column 21 corresponding to the node module that is not pulled out blocked by the stopping block 32.

Because the node module, when pulled out, moves in a straight line in the y-axis direction, the limiting column 21 may merely move in a straight line in the x-axis direction. Therefore, when the pulled-out node module moves in the direction of the arrow II, it pushes the locking rod 2 to move along the x-axis, and the other limiting column 21 moves along the arrow IV, to reach the position shown in FIG. 2C. The limiting column 21 contacts the blocking edge 321 of the stopping block 32 to block it, and at this point the node module that is not pulled out cannot be pulled out in the y-axis direction.

Figure 3A:
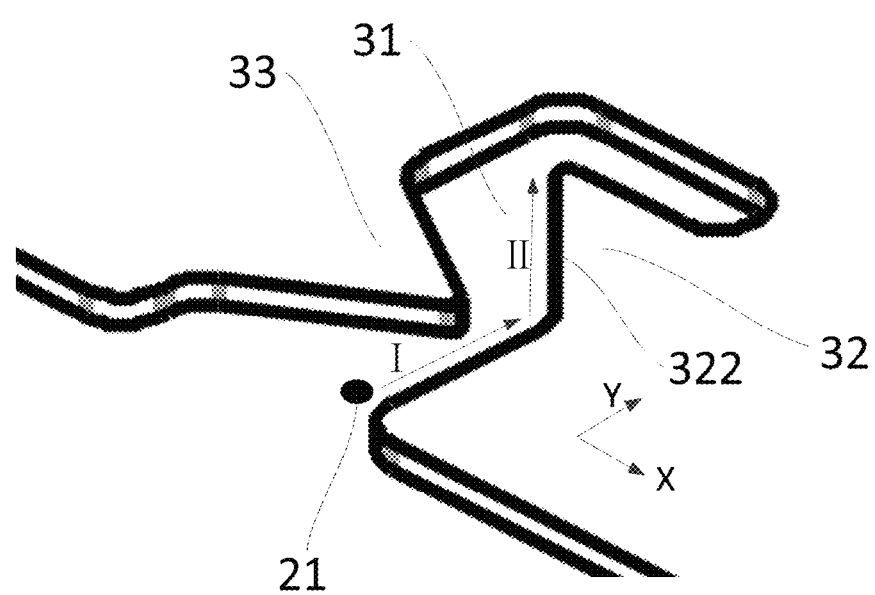
FIG. 3A is the moving path of the limiting column corresponding to the pulled-out node module when the pulled-out node module moves inwardly relatively to the guiding groove.

As shown in FIG. 3A, FIG. 3A is the moving path of the limiting column 21 corresponding to the pulled-out node module when the pulled-out node module moves inwardly relatively to the guiding groove 31. The node module drives the guiding plate 3 to move in the y-axis direction, and the limiting column 21 moves along the arrow I to contact the unlocking guiding edge 322 of the stopping block 32, and moves along the unlocking guiding edge 322 along the arrow II.

Figure 3B:
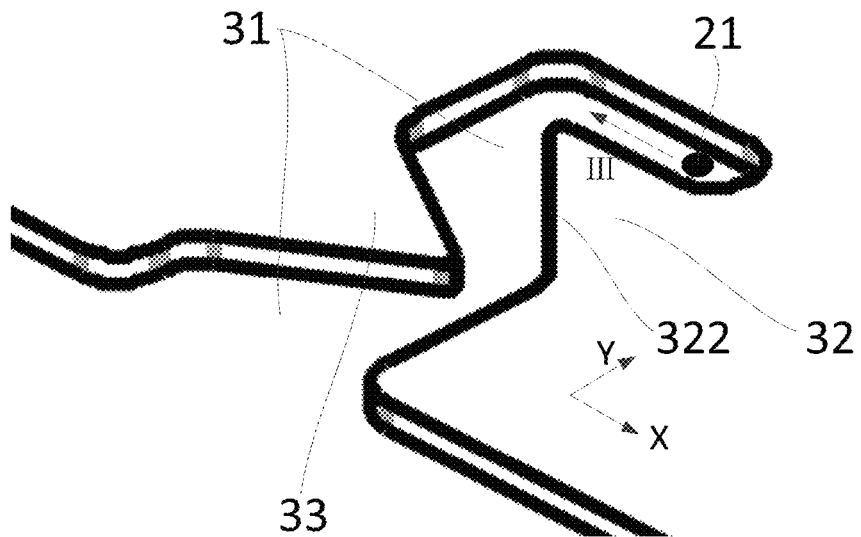
FIG. 3B is the moving path of the limiting column corresponding to the unlocking process of the node module that is not pulled out relatively to the guiding groove.

As shown in FIG. 3B, FIG. 3B is the moving path of the limiting column 21 corresponding to the unlocking process of the node module that is not pulled out relatively to the guiding groove 31. The limiting column 21 and the locking rod 2 move in the direction shown by the arrow III. After reaching the unlocking position, all of the guiding plates 3 are not blocked by the limiting columns 21, and any one of the node modules may be pulled out.

The guiding sloping block 33 further includes a resetting guiding edge 332, the resetting guiding edge 332 forms a horn mouth at the notch of the guiding groove 31, and an acute angle is formed between the resetting guiding edge 332 and the locking-up guiding edge 331. In other words, the whole guiding sloping block 33 is an acute triangle. Because the structure of a horn mouth is formed, when the limiting column 21 enters the guiding groove 31 along the arrow I in FIG. 3A, it has a large fault-tolerance space, and when the limiting column 21 contacts the resetting guiding edge 332, the limiting column 21 may also normally enter.

Figure 4A:
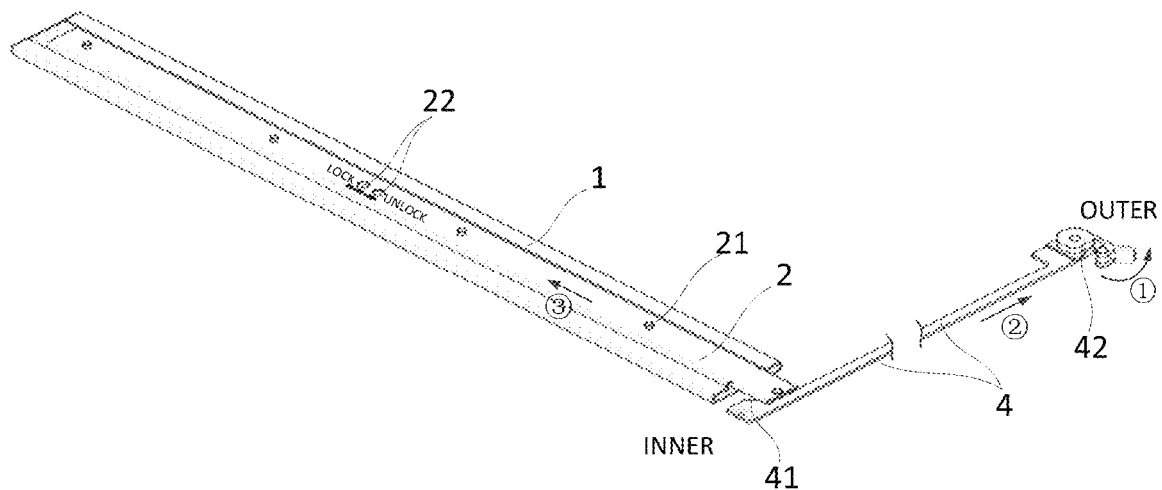
FIG. 4A and FIG. 4B are schematic diagrams of the un-unlocking state and the unlocking state of the unlocking connecting rod respectively.
Figure 4B:
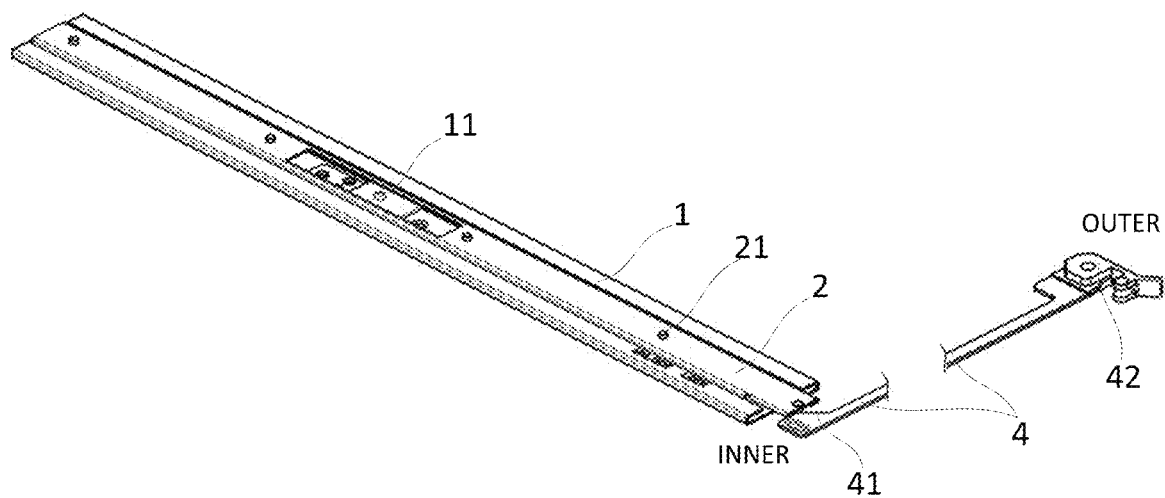

Referring to FIGS. 4A and 4B, FIG. 4B shows a schematic structure of a rectangular orifice formed when the linking interlocking rod 2 is cut at the middle part. A damping elastic sheet 11 is disposed at the guiding rail 1. The damping elastic sheet 11 has an elastic force in the vertical direction, and may be pressed downwardly or rebound upwardly. Without the effect of an external force, the damping elastic sheet 11 protrudes upwardly due to the elastic force. The locking rod 2 is provided with two damping holes 22. The two damping holes 22 are disposed in the length direction of the locking rod 2, the damping elastic sheet 11 has protrusions of a spherical shape, and the spherical protrusions of the damping elastic sheet 11 may be individually stuck into the damping holes 22 to realize the elastic limiting. When the locking rod 2 is translating to the unlocking position or the unlocking position, the damping elastic sheet 11 is elastically limited by one of the damping holes 22.

Referring to FIG. 4A, when one of the node modules is pulled out, it drives the locking rod 2 to move toward the right lower corner, and the damping elastic sheet 11 is stuck into the damping hole 22 marked with LOCK on the left. When the node module is pushed back, it drives the locking rod 2 to move toward the left upper corner, and the damping elastic sheet 11 is stuck into the damping hole 22 marked with UNLOCK on the right. When the locking rod 2 moves in the area between the unlocking position and the locking position, the damping elastic sheet 11 is pressed downwardly to contact the lower surface of the locking rod 2.

By disposing the damping hole 22 and the damping elastic sheet 11, when the unlocking position or the locking position is reached, a clear feedback is generated. Furthermore, the movement from the unlocking position or the locking position to the other position requires overcoming a large resistance, which prevents accidental unlocking or locking.

As shown in FIG. 1B, the guiding plate 3 laterally protrudes at an inner end portion of the node module. In some embodiments, the guiding plate 3 may also be disposed under the node module.

On the basis of any one of the above technical solutions and the combinations thereof, the present application further includes an unlocking connecting rod 4, the extending direction of the unlocking connecting rod 4 is parallel to the moving direction of the node modules, and the unlocking connecting rod 4 may move in the length direction. An unlocking lean edge 41 is disposed at an inwardly stretching end of the unlocking connecting rod 4, and the width of the unlocking lean edge 41 is greater than the width of the main-body part in the middle of the unlocking connecting rod 4. When the unlocking connecting rod 4 moves in the unlocking direction, the unlocking lean edge 41 drives the locking rod 2 to move from the unlocking position to the unlocking position. By using the unlocking connecting rod 4, the locking rod 2 may be independently moved to the unlocking state, thereby releasing the locking of the other node module. If needed, the unlocking connecting rod 4 may be operated to unlock the other node module.

The unlocking direction is parallel to the moving direction of the node modules, an outwardly stretching end of the unlocking connecting rod 4 is rotatably connected to an unlocking handle 42, and when the unlocking handle 42 rotates, the unlocking handle 42 is capable of driving the unlocking connecting rod 4 to move outwardly parallel to the node modules to realize unlocking.

As shown in FIG. 4A, FIG. 4A is a schematic structural diagram of the unlocking connecting rod 4. FIG. 4B is a schematic diagram of the process of pushing the locking rod 2 by the unlocking connecting rod 4. The length direction of the unlocking connecting rod 4 is parallel to the moving direction of the node modules. Firstly the unlocking handle 42 rotates along the curve arrow ①, and the unlocking connecting rod 4 synchronously moves along the arrow ②, and drives the locking rod 2 via the unlocking lean edge 41 to move along the arrow ③, to push the locking rod 2 to be unlocked.

The present application further provides a server, wherein the server includes the multi-node safe locking device stated above. The server may realize the same technical effect.

The above description on the disclosed embodiments enables a person skilled in the art to implement or use the present application. Various modifications on those embodiments may be apparent to a person skilled in the art, and the general principle defined herein may be implemented in other embodiments without departing from the spirit or scope of the present application. Therefore, the present application should not be limited to the embodiments illustrated herein, but should meet the broadest scope in accord with the principle and the novel characteristics disclosed herein.

The invention claimed is:

1. A multi-node safe locking device, wherein the multi-node safe locking device comprises a guiding rail, a locking rod and a plurality of guiding plates, and the guiding rail is disposed on a chassis, to enable the locking rod to translate perpendicularly to a moving direction of a plurality of node modules;

each of the guiding plates is assembled on one of the node modules, respectively, and each of the guiding plates is provided with a guiding groove; a plurality of limiting columns protrude out of the locking rod, each of the limiting columns is correspondingly insertable into one of the guiding grooves, and the limiting column is movable along a guiding path in the guiding groove;

when one of the node modules is pulled out, the guiding groove enables the locking rod to translate to a locking position, to block the other node module from being pulled out; one of the guiding plates that is mounted to the pulled out node module and the corresponding limiting column are separated from a notch of the guiding groove; and when one of the node modules is pushed back inwardly, the limiting column corresponding to the node module enters from the notch of the guiding groove, and the guiding groove causes the locking rod to translate to an unlocking position;

wherein the guiding groove is an opening that perpendicularly extends throughout a plane of the guiding plate.

2. The multi-node safe locking device according to claim 1, wherein the guiding groove is a groove, one side of the groove is provided with a stopping block and the other side of the groove is provided with a guiding sloping block, the stopping block and the guiding sloping block are protruding towards each other, a projection of the stopping block and a projection of the guiding sloping block in the moving direction of the node modules have an overlapping part, and the stopping block is further from the notch than the guiding sloping block;

the stopping block comprises a blocking edge and an unlocking guiding edge, the blocking edge is parallel to a translating direction of the locking rod, and an acute angle is formed between the unlocking guiding edge and the blocking edge; and the guiding sloping block comprises a locking-up guiding edge, and an acute angle is formed between the locking-up guiding edge and the blocking edge.

3. The multi-node safe locking device according to claim 2, wherein the guiding sloping block further comprises a resetting guiding edge, and the resetting guiding edge forms a horn mouth at the notch of the guiding groove.

4. The multi-node safe locking device according to claim 1, wherein a damping elastic sheet is disposed on the guiding rail, the locking rod is provided with two damping holes, and when the locking rod translates to the unlocking position or the locking position, the damping elastic sheet is elastically limited by one of the damping holes.

5. The multi-node safe locking device according to claim 1, wherein the guiding plate is disposed horizontally, and is laterally protruded at an inner end portion of the node module.

6. The multi-node safe locking device according to claim 1, wherein the multi-node safe locking device further comprises an unlocking connecting rod, an extending direction of the unlocking connecting rod is parallel to the moving direction of the node modules, and the unlocking connecting rod moves in the extending direction; and an unlocking lean edge is disposed at an inwardly stretching end of the unlocking connecting rod, and when the unlocking connecting rod moves in an unlocking direction, the unlocking lean edge pushes the locking rod to move from the unlocking position to the unlocking position.

7. The multi-node safe locking device according to claim 6, wherein an outwardly stretching end of the unlocking connecting rod is rotatably connected to an unlocking handle, and when the unlocking handle rotates, the unlocking handle is capable of driving the unlocking connecting rod to move outwardly parallel to the node modules to realize unlocking.

8. A server, wherein the server comprises the multi-node safe locking device according to claim 1.

9. The multi-node safe locking device according to claim 1, wherein the limiting column moves in a straight line along with the locking rod, the guiding groove moves in a straight line along with the guiding plate, a moving direction of the locking rod and a moving direction of the guiding plate are substantially perpendicular to each other, and the limiting column moves in different directions in sequence along a guiding path of the guiding groove.

10. The multi-node safe locking device according to claim 1, wherein when one of the node modules is pulled out, side edges of the guiding groove apply an acting force to the limiting column, so that the locking rod is capable to translate to a locking position, and the other limiting columns block the other node modules from being pulled out.

11. The multi-node safe locking device according to claim 2, wherein when the node module is pulled outwardly, the limiting column contacts the locking-up guiding edge;

when the pulled-out node module is pushed back, the limiting column contacts the unlocking guiding edge, the unlocking guiding edge and the locking-up guiding edge are substantially parallel, and the unlocking guiding edge pushes the locking rod to move toward the unlocking position.

12. The multi-node safe locking device according to claim 2, wherein an outline of the stopping block is of a triangle, and there is a spacing between the blocking edge and the edge at an outmost side of the guiding groove.

13. The multi-node safe locking device according to claim 1, wherein when the locking rod is at the unlocking position, all of the guiding plates are not blocked by the limiting columns, and any one of the node modules is capable of being pulled out; and when a certain node module is pulled out, the locking rod is driven to move to the locking position again.

14. The server according to claim 8, wherein the guiding groove is formed by a stopping block and a guiding sloping block that are located at two sides of the guiding groove and relatively protruding, a projection of the stopping block and a projection of the guiding sloping block in the moving direction of the node modules have an overlapping part, and the stop block is more lateral than the guiding sloping block;

the stopping block comprises a blocking edge and an unlocking guiding edge, the blocking edge is parallel to a translating direction of the locking rod, and an acute angle is formed between the unlocking guiding edge and the blocking edge; and the guiding sloping block comprises a locking-up guiding edge, and an acute angle is formed between the locking-up guiding edge and the blocking edge.

15. The server according to claim 14, wherein the guiding sloping block further comprises a resetting guiding edge, and the resetting guiding edge forms a horn mouth at the notch of the guiding groove.

16. The server according to claim 8, wherein a damping elastic sheet is disposed on the guiding rail, the locking rod is provided with two damping holes, and when the locking rod translates to the unlocking position or the locking position, the damping elastic sheet is elastically limited by one of the damping holes.

17. The server according to claim 8, wherein the guiding plate is disposed horizontally, and is laterally protruded at an inner end portion of the node module.

* * * * *